United States Patent
Sung et al.

(10) Patent No.: US 7,672,167 B2
(45) Date of Patent: Mar. 2, 2010

(54) NON-VOLATILE MEMORY DEVICE

(75) Inventors: Jung-hun Sung, Yongin-si (KR); Ju-hee Park, Guri-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 12/081,358

(22) Filed: Apr. 15, 2008

(65) Prior Publication Data
US 2009/0103366 A1    Apr. 23, 2009

(30) Foreign Application Priority Data
Oct. 17, 2007    (KR)    ..................... 10-2007-0104475

(51) Int. Cl.
*G11C 16/06*    (2006.01)
*G11C 16/04*    (2006.01)

(52) U.S. Cl. ..................... 365/185.21; 365/185.17; 365/208

(58) Field of Classification Search ............. 365/185.21
See application file for complete search history.

(56) References Cited

U.S. PATENT DOCUMENTS

| | | | | |
|---|---|---|---|---|
| 5,996,041 A | * | 11/1999 | Kim | 711/103 |
| 6,031,760 A | * | 2/2000 | Sakui et al. | 365/185.21 |
| 6,288,944 B1 | * | 9/2001 | Kawamura | 365/185.22 |
| 2008/0247228 A1 | * | 10/2008 | Nguyen et al. | 365/185.2 |

* cited by examiner

*Primary Examiner*—Son L Mai
(74) *Attorney, Agent, or Firm*—Harness, Dickey & Pierce, P.L.C.

(57) ABSTRACT

A non-volatile memory device may include at least one string, at least one bit line corresponding to the at least one string, and/or a sensing transistor. The at least one string may include a plurality of memory cell transistors connected in series. The sensing transistor may include a gate configured to sense a voltage of the corresponding bit line. A threshold voltage of the sensing transistor may be higher than a voltage obtained by subtracting a given voltage from a voltage applied to read the corresponding bit line connected to a memory cell transistor to be read of the plurality of memory cell transistors.

19 Claims, 5 Drawing Sheets

NON-VOLATILE MEMORY DEVICE

PRIORITY STATEMENT

This application claims the benefit of priority to Korean Patent Application No. 10-2007-0104475, filed on Oct. 17, 2007, in the Korean Intellectual Property Office, the entire contents of which are incorporated herein in their entirety by reference.

BACKGROUND

1. Field

Example embodiments relate to a non-volatile memory device, and for example, to a non-volatile memory device including a sensing transistor with a higher threshold voltage.

2. Description of Related Art

Non-volatile memory devices capable of electrically erasing and programming may store data even if a power source is not applied thereto. Non-volatile memory devices may be flash memory.

Flash memory is a device storing data using a charge storage. Each memory cell forming the flash memory is formed of a cell transistor including a control gate, a charge storage layer, a source, and a drain. The flash memory adjusts an amount of charge stored in the charge storage layer to change values of data written on the memory cells.

If a charge is injected into the charge storage layer of the cell transistor, the threshold voltage of the cell transistor increases. If a charge is erased from the charge storage layer of the cell transistor, the threshold voltage of the cell transistor decreases.

A state where the charge storage layer has a negative charge and the threshold voltage of the cell transistor is negative (e.g., minus) is referred to as an erase state. A state where the charges are injected into the charge storage layer and the threshold voltage of the cell transistor is larger than 0 is referred to as a program state.

SUMMARY

Example embodiments provide a non-volatile memory device including a sensing transistor with a higher threshold voltage.

According to an example embodiment, a non-volatile memory device may include at least one string including a plurality of memory cell transistors connected in series, at least one bit line corresponding to the at least one string, and a sensing transistor including a gate configured to sense a voltage of the corresponding bit line, wherein a threshold voltage of the sensing transistor is higher than a saturated voltage of the corresponding bit line if the corresponding bit line is read.

According to an example embodiment, a non-volatile memory device may include at least one string, at least one bit line corresponding to the at least one string, and/or a sensing transistor. The at least one string may include a plurality of memory cell transistors connected in series. The sensing transistor may include a gate configured to sense a voltage of the corresponding bit line. A threshold voltage of the sensing transistor may be higher than a voltage obtained by subtracting a given voltage from a voltage applied to read the corresponding bit line connected to a memory cell transistor to be read of the plurality of memory cell transistors.

According to an example embodiment, the at least one string may include a string selection transistor having a gate connected to a string selection line and/or a ground selection transistor having a gate connected to the corresponding bit line. Gates of the plurality of memory cell transistors may be connected to corresponding word lines.

According to an example embodiment, the non-volatile memory device may further include a precharge transistor for precharging the bit line. The precharge transistor may include a PMOS transistor and a ground voltage may be applied to a gate of the precharge transistor to precharge the bit line.

The sensing transistor may be included in a page buffer.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
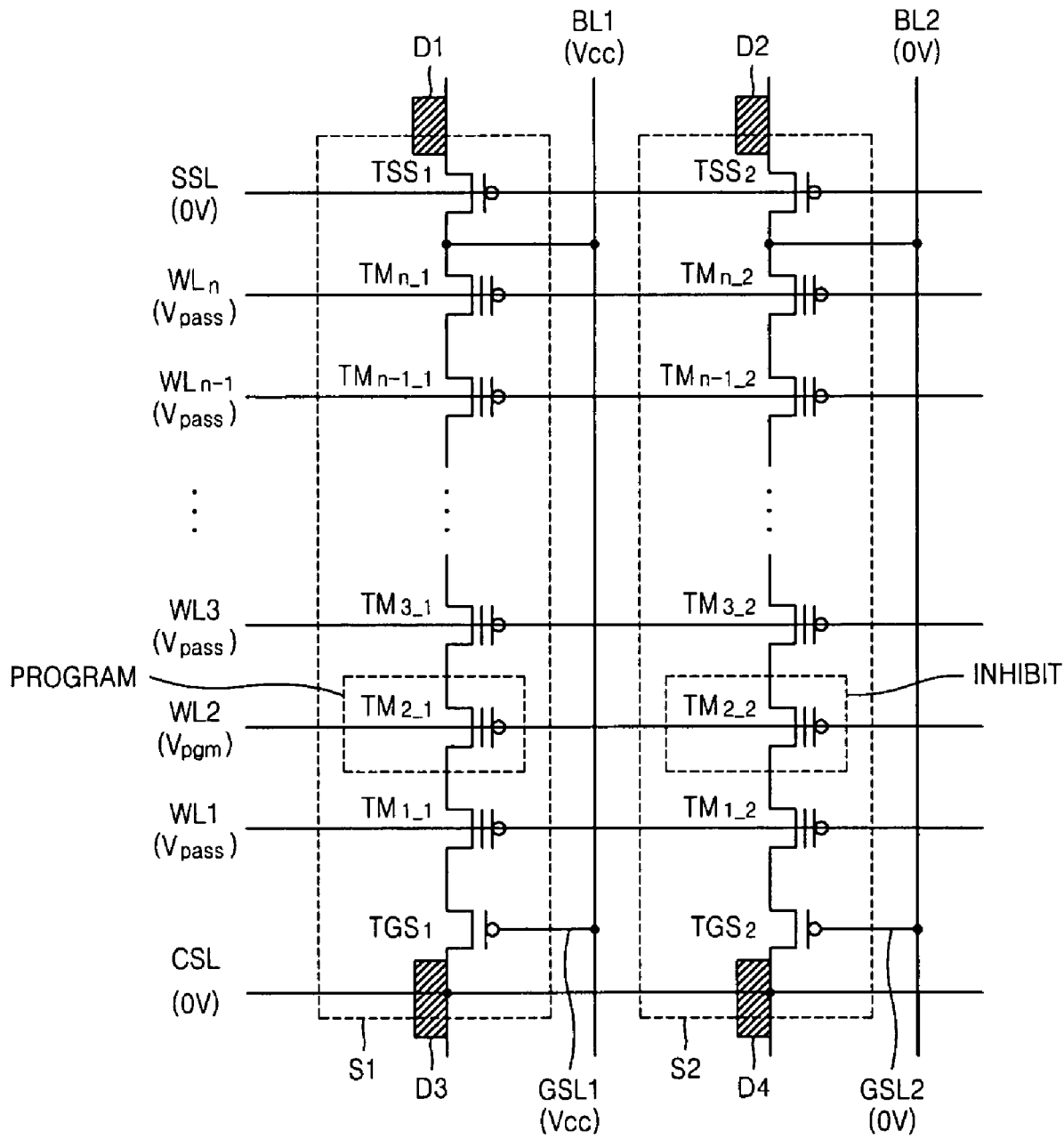
FIG. 1 is a circuit diagram for explaining a programming process in at least one string including a plurality of memory cell transistors.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
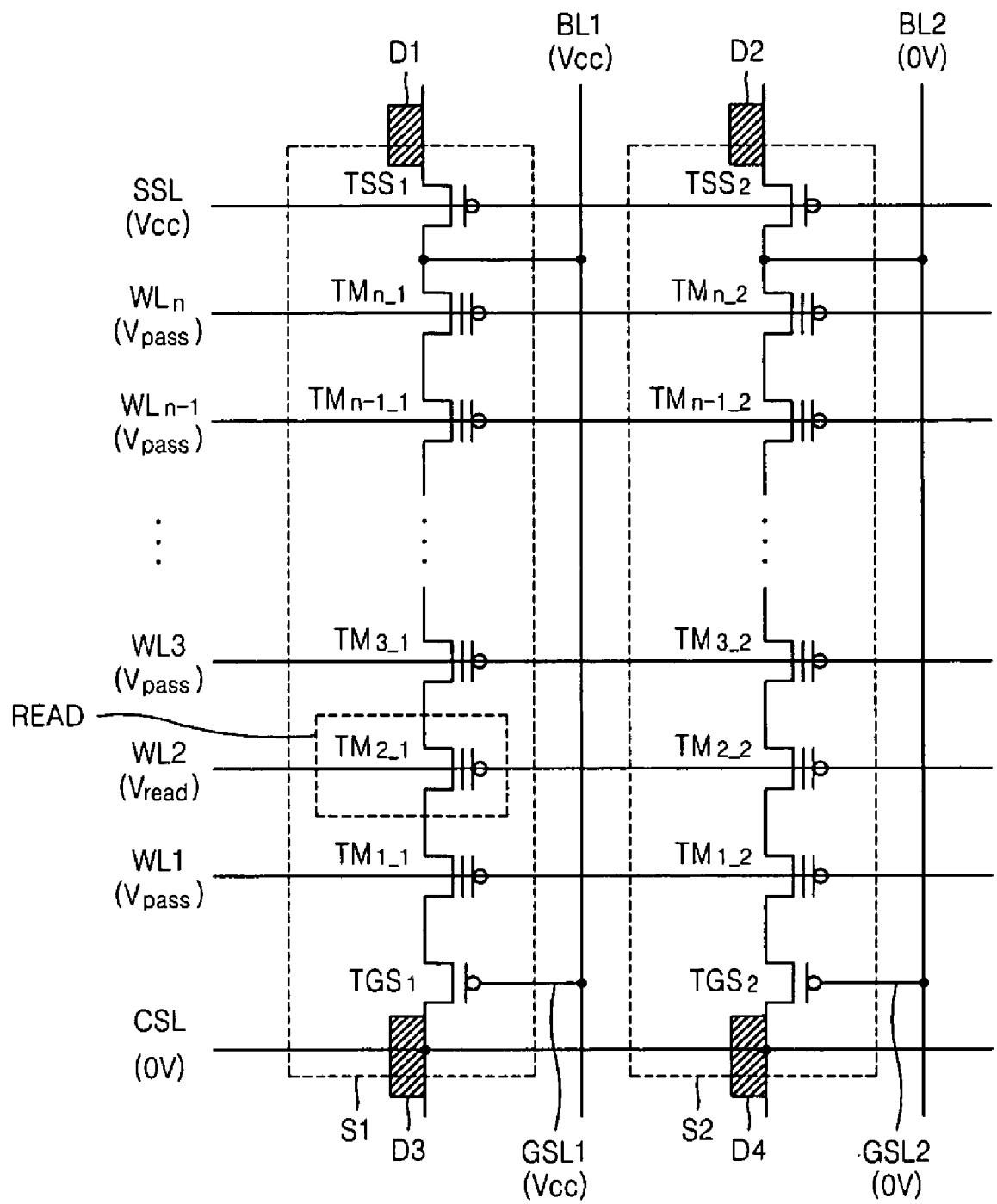
FIG. 2 is a circuit diagram for explaining a reading process in at least one string including a plurality of memory cell transistors.

FIGS. 1-2 illustrate two strings S1 and S2. However, the number of the strings, two, is only an example for convenience of description, and the number of the strings is not limited to two in example embodiments. The string S1 may include a plurality of memory cell transistors TM1_1 through TMn_1 connected between a string selection transistor TSS1 and a ground selection transistor TGS1. The string selection transistor TSS1 and the ground selection transistor TGS1 may be connected to first source and drain regions D1 and D3, respectively. A gate of the string selection transistor TSS1 may be connected to a string selection line SSL. A gate of the ground selection transistor TGS1 may be connected to a bit line BL1, e.g., through a gate selection line GSL1. A common source line CSL may be connected to the first source or drain region D3. Similarly, the string S2 may include a plurality of memory cell transistors TM1_2 through TMn_2 connected between a string selection transistor TSS2 and a ground selection transistor TGS2. The string selection transistor TSS2 and the ground selection transistor TGS2 may be connected to first source and drain regions D2 and D4, respectively. A gate of the string selection transistor TSS2 may be connected to the string selection line SSL. A gate of the ground selection transistor TGS2 may be connected to a bit line BL2, e.g., through a gate selection line GSL2. The common source line CSL may be connected to the first source or drain region D4. Word lines WL1 through WLn may be connected to gates of the memory cells transistors TM1_1 through TMn_1 and TM1_2 through TMn_2 of the first and second strings S1 and S2.

FIG. 1 is a circuit diagram for explaining a programming process in at least one string including a plurality of memory cell transistors.

Hereinafter, a memory cell transistor TM2_1 may be a memory cell transistor to be programmed.

In order to program the memory cell transistor TM2_1, a first voltage Vcc may be applied to a bit-line BL1 connected to the string S1 in which the memory cell transistor TM2_1 is included. From among memory cell transistors TM1_1 through TMn_1 included in the string S1, a programming voltage Vpgm may be applied to a control gate of the memory cell transistor TM2_1 and/or a pass voltage may be applied to control gates of remaining memory cell transistors TM1_1 and TM3_1 through TMn_1. The pass voltage Vpass may be a voltage for turning on the memory cell transistors and the programming voltage Vpgm may be a voltage for injecting a charge into a charge storage layer of the memory cell transistor. The programming voltage Vpgm may be higher than the pass voltage Vpass. The programming voltage Vpgm and the pass voltage Vpass may be applied through the word lines WL1-WLn connected to the control gates of the memory cell transistors TM1_1 through TMn_1.

A ground voltage may be applied to the bit-line BL2 connected to the string S2 in order to prevent programming of the memory cell transistors TM1_2 through TMn_2 of the string S2.

FIG. 2 is a circuit diagram for explaining a reading process in at least one string including a plurality of memory cell transistors.

Hereinafter, the memory cell transistor TM2_1 may be a memory cell transistor to be read.

In order to perform a reading process for the memory cell transistor TM2_1, the first voltage Vcc may be applied to the bit-line BL1, a read voltage Vread may be applied to the control gate of the memory cell transistor TM2_1, and/or the pass voltage Vpass may be applied to the control gates of the remaining memory cell transistors TM1_1 and TM3_1 through TMn_1.

The read voltage Vread applied to the control gate of the memory cell transistor TM2_1 may be higher than a threshold voltage of the memory cell transistor in an erase state and lower than a threshold voltage of the memory cell transistor in a programming state. If the memory cell transistor TM2_1 is in an erase state, the read voltage Vread may be higher than a threshold voltage of the memory cell transistor TM2_1 to be read. Accordingly, if the read voltage Vread is applied to the memory cell transistor TM2_1 in an erase state, the memory cell transistor TM2_1 may be turned on and a current may flow through the memory cell transistor TM2_1 to be read. On the other hand, if the memory cell transistor TM2_1 is in a programming state, the read voltage Vread may be lower than a threshold voltage of the memory cell transistor TM2_1 to be read. Accordingly, if the read voltage Vread is applied to the memory cell transistor TM2_1 in a programming state, the memory cell transistor TM2_1 may be turned off or slightly turned on so that a current may not flow through the memory cell transistor TM2_1 or a relatively smaller amount of current flows through the memory cell transistor TM2_1. For example, slightly turning on the memory cell transistor may denote that the memory cell transistor TM2_1 to be read is turned on slightly less than the memory cell transistor TM2_1 to be read in an erase state. The smaller amount of current that may flow through the memory cell transistor TM2_1 to be read may be a current less than that of a current of the memory cell transistor TM2_1 to be read flowing in an erase state.

The pass voltage Vpass applied to the control gates of the remaining memory cell transistors TM1_1 and TM3_1 through TMn_1 may be a voltage, e.g., a minimum voltage, which allows a current to flow through the memory cell transistors TM1_1 and TM3_1 through TMn_1, regardless of the state of the memory cell transistors TM1_1 and TM3_1 through TMn_1. For example, regardless of whether the memory cell transistors TM1_1 and TM3_1 through TMn_1 are in an erase state or in a programming state, the pass voltage Vpass may be higher than a threshold voltage of the memory cell transistors TM1_1 and TM3_1 through TMn_1.

Accordingly, if the pass voltage Vpass is applied to the control gates of the memory cell transistors TM1_1 and TM3_1 through TMn_1, the memory cell transistors TM1_1 and TM3_1-TMn_1 may be turned on and a current may flow through the memory cell transistors TM1_1 and TM3_1 through TMn_1.

If the remaining memory cell transistors TM1_1 and TM3_1 through TMn_1 are turned on by applying the first voltage Vcc to the bit line BL1 and applying the pass voltage Vpass to the word lines WL1 and WL 3 through WLn corresponding to the remaining memory cell transistors TM1_1 and TM3_1 through TMn_1 and the read voltage Vread is applied to the memory cell transistor TM2_1 to be read, a current may flow through the memory cell transistors TM1_1 through TMn_1 if the memory cell transistor TM2_1 to be read is in an erase state. Accordingly, the bit line BL1 may be discharged and a voltage of the bit line BL1 may not maintain to the first voltage Vcc, thereby decreasing near to 0 v. On the other hand, if the memory cell transistor TM2_1 to be read is in a programming state, a current may not flow through the memory cell transistors TM1_1 through TMn_1 or a relatively smaller amount of current may flow through the memory cell transistors TM1_1 through TMn_1. Accordingly, the bit line BL1 may not be discharged or only slightly discharged so that a voltage of the bit line BL1 may maintain the first voltage Vcc or only slightly decrease from the first voltage Vcc.

Accordingly, after the first voltage Vcc is applied to the bit line BL1 and the read voltage Vread and the pass voltage Vpass are applied to the memory cell transistors TM1_1 through TMn_1, a voltage of the bit line BL1 may be measured to determine whether the memory cell transistor TM2_1 to be read is in an erase state or a programming state.

However, the bit line BL1 is connected to the control gate of the ground selection transistor TGS1 in the string S1 of FIG. 2. Accordingly, because the memory cell transistor TM2_1 to be read is in an erase state so that a current flows through the memory cell transistors TM1_1 through TMn_1 and a voltage of the bit line BL1 starts decreasing, a voltage applied to the control gate of the ground selection transistor TGS1 may start decreasing. Accordingly, the degree that the ground selection transistor TGS1 is turned on may decrease and an amount of current flowing through the memory cell transistors TM1_1 through TMn_1 may decrease. Therefore, a voltage of the bit line BL1 may not further decrease and may be saturated at a desired, or alternatively, a predetermined voltage level. The desired, or alternatively, the predetermined voltage level may be higher than 0V.

As such, if the memory cell transistor TM2_1 to be read is in an erase state, a voltage of the bit line BL1 in a structure where the bit line BL1 is not connected to the control gate of the ground selection transistor TGS1 decreases nearer to 0V. However, a voltage of the bit line BL1 in a structure where the bit line BL1 is connected to the control gate of the ground selection transistor TGS1 may not decrease nearer to 0V.

If the memory cell transistor TM2_1 to be read is in a programming state, a voltage of the bit line BL1 may maintain the first voltage Vcc that is applied to the bit line BL1 in an initial stage, regardless of whether the bit line BL1 is connected to the control gate of the ground selection transistor TGS1.

Figure 4A:
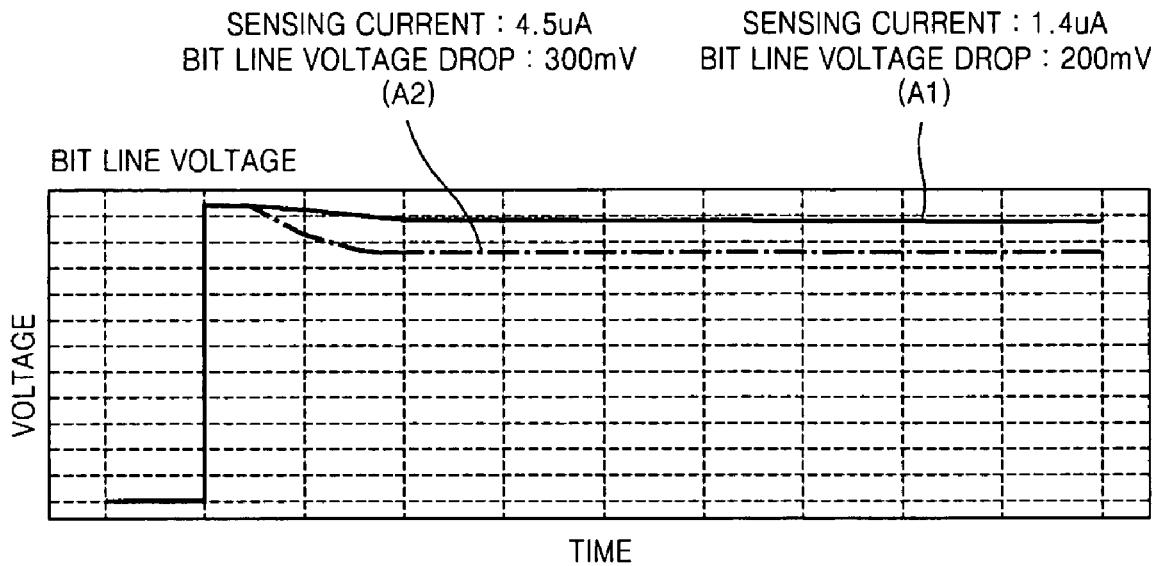
FIGS. 4A and 4B are example graphs respectively illustrating an example voltage and an example current of a bit-line in a non-volatile memory device of FIG. 1 and FIG. 2.

FIG. 4A is an example diagram illustrating a change of a voltage of the bit line in a non-volatile memory device in FIG. 1 and FIG. 2.

In FIG. 4A, if the memory cell transistor TM2_1 to be read is in an erase state in a structure where the bit line BL1 is connected to the control gate of the ground selection transistor TGS1, a voltage of the bit line BL1 decreases by about 200 mV as shown in A1 or a voltage of the bit line BL1 decreases by about 300 mV as shown in A2. Although not shown in FIG. 4A, if the memory cell transistor TM2_1 to be read is in an erase state in a structure where the bit line BL1 is not connected to the control gate of the ground selection transistor TGS1, a voltage drop that is greater than about 300 mV may occur in the bit line BL1.

Figure 4B:
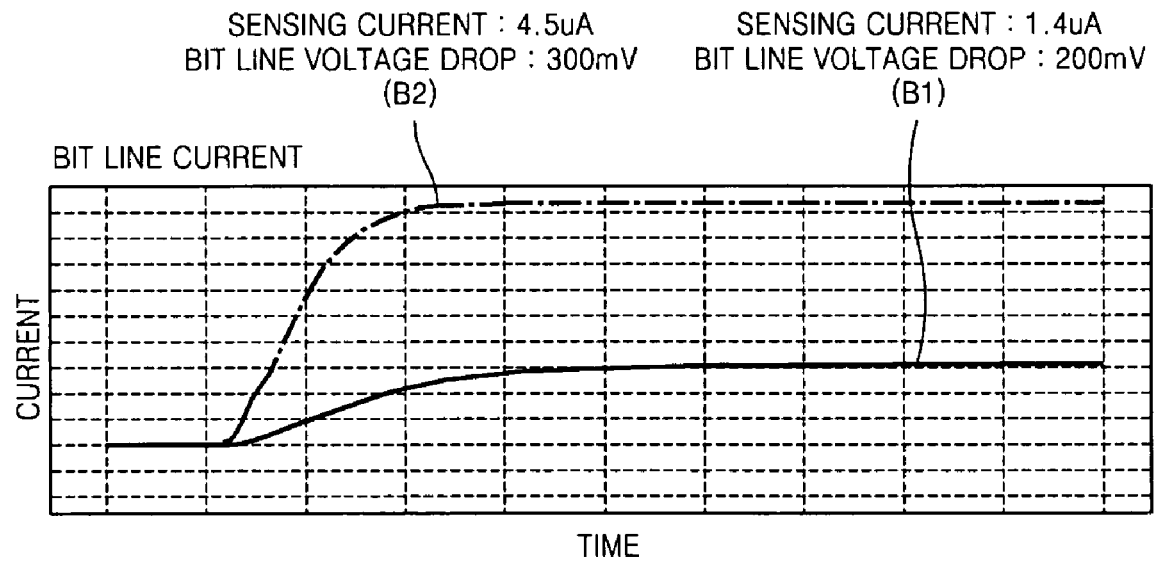

FIG. 4B is a diagram illustrating a change of a current of the bit line in a non-volatile memory device in FIG. 1 and FIG. 2.

In FIG. 4B, if the memory cell transistor TM2_1 to be read is in an erase state in a structure where the bit line BL1 is connected to the control gate of the ground selection transistor TGS1, a current of about 1.4 uA flows through the bit line BL1 as shown in B1 or a current of about 4.5 uA flows through the bit line BL1 as shown in B2.

Figure 3:
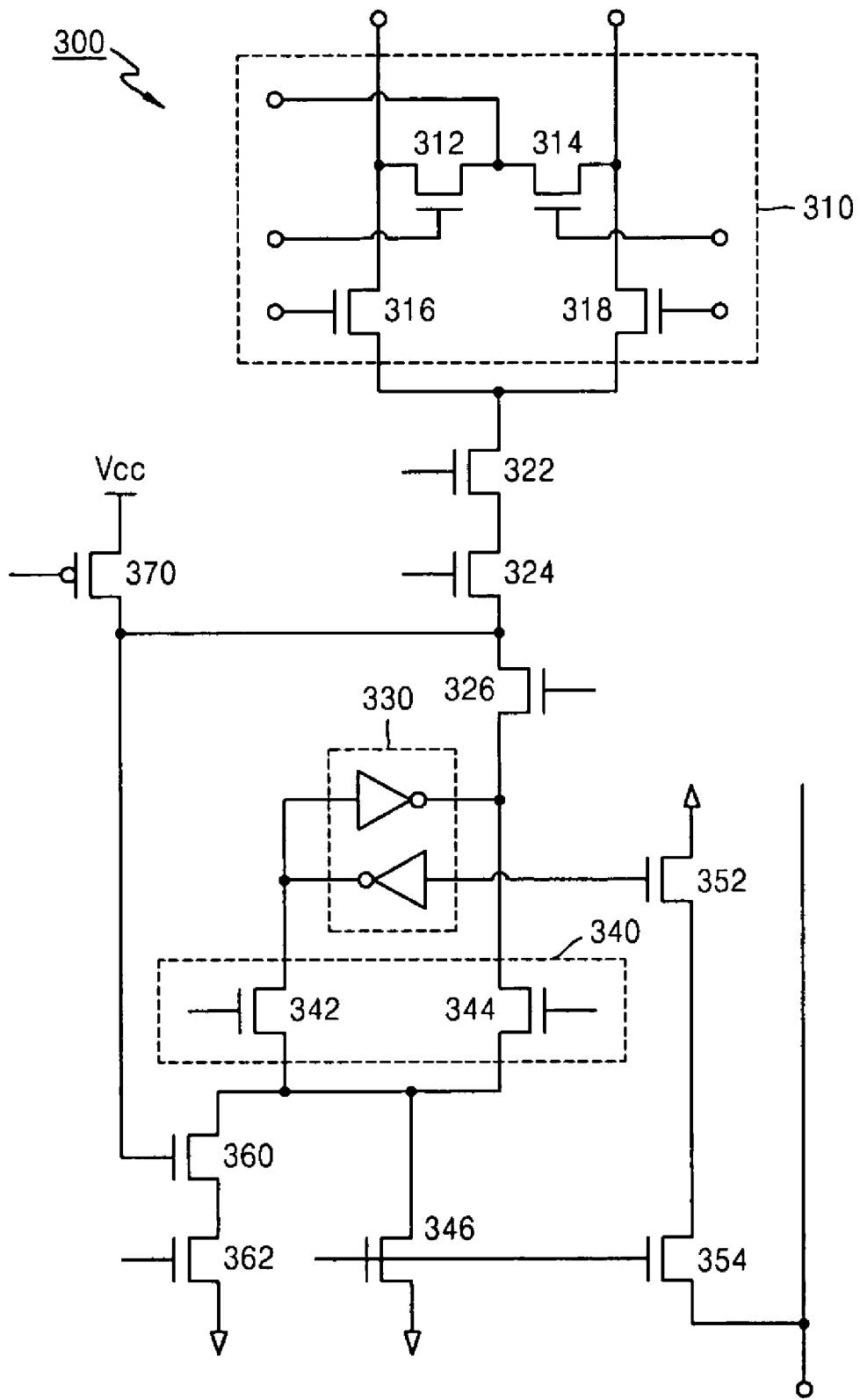
FIG. 3 is a circuit diagram illustrating a sensing circuit of a non-volatile memory device according to an example embodiment.

FIG. 3 is a circuit diagram illustrating a sensing circuit of a non-volatile memory device according to an example embodiment.

Referring to FIG. 3, the sensing circuit 300 may determine whether the memory cell transistor TM2_1 to be read is in an erase state or a programming state. The sensing circuit 300 may include a sensing transistor 360, the sensing transistor 360 having a gate for receiving voltages of the bit lines BL1 and BL2.

The sensing transistor 360 may have a higher threshold voltage. A voltage of the bit line BL1 according to the state of the memory cell transistor TM2_1 to be read may be identified in a structure where the bit line BL1 is connected to the control gate of the ground selection transistor TGS1, e.g., as shown in FIGS. 1-2, by using the sensing transistor 360 of FIG. 3.

For example, in a structure where the bit line BL1 is connected to the control gate of the ground selection transistor TGS1, if the memory cell transistor TM2_1 to be read is in an erase state, a voltage of the bit line BL1 does not decrease as near to 0V and if the memory cell transistor TM2_1 to be read is in a programming state, a voltage of the memory cell transistor TM2_1 to be read may maintain the first voltage Vcc. If the sensing transistor 360, a gate of which receives a voltage of the bit line BL1, has a higher threshold voltage, the sensing transistor 360 may be turned off if a voltage of the bit line does not decrease as near to 0V. However, the sensing transistor 360 may be turned on if a voltage of the bit line BL1 maintains the first voltage Vcc. For example, if the memory cell transistor TM2_1 to be read is in an erase state, the sensing transistor 360 may be turned off and if the memory cell transistor TM2_1 to be read is in a programming state, the sensing transistor 360 may be turned on.

On the other hand, if the sensing transistor 360 has a lower threshold voltage, the sensing transistor 360 may be turned on regardless of the state of the memory cell transistor TM2_1 to be read in a structure where the bit line BL1 is connected to the control gate of the ground selection transistor TGS1 because a voltage of the bit line does not decrease to 0V. Accordingly, a voltage of the bit line BL1 according to the state of the memory cell transistor TM2_1 to be read may not be identified in a structure where the bit line BL1 is connected to the control gate of the ground selection transistor TGS1 by using the sensing transistor 360 of FIG. 3 if the sensing transistor 360 has a lower threshold voltage.

A threshold voltage of the sensing transistor 360 may be lower than a voltage applied to the read bit line connected to the memory cell transistor to be read and may be higher than a voltage obtained by subtracting a desired, or alternatively, a predetermined voltage from a voltage applied to the read bit line. For example, the desired, or alternatively, the predetermined voltage may have a voltage level dropped until a voltage of the read bit line connected to the memory cell transistor to be read in an erase state is saturated in the structure where the bit line BL1 is connected to the control gate of the ground selection transistor TGS1. For example, the voltage obtained by subtracting the desired, or alternatively, the predetermined voltage from the voltage applied to the read bit line may have a saturated voltage level of the read bit line. The saturated voltage level of the read bit line is described above with reference to FIG. 2.

Referring to FIG. 3, the non-volatile memory device may further include a bit line selection circuit 310, a precharge transistor 370, a latch circuit 330, a main verification circuit 352, and/or a main data input circuit 340. The precharge transistor 370 may be a PMOS transistor. The bit line selection circuit 310 may select one bit line from among the bit lines and connect the selected bit line to other elements of the sensing circuit 300. The bit line selection circuit 310 may include four transistors 312, 314, 316, and 318. The precharge transistor 370 may precharge the selected bit line to a desired, or alternatively, a predetermined voltage (for example, the first voltage Vcc). The precharge transistor 370 will be described later with reference to FIG. 5. First terminals of the transistors 316 and 318 may be connected to a first terminal of transistor 322, which is connected in series with a transistor 324, and/or a first terminal of the transistor 324 may be connected to a first terminal of the precharge transistor 370 connected to a gate of the sensing transistor and a first terminal of a transistor 326 connected to the latch circuit 330.

The latch circuit 330 may include two inverters. The latch circuit 330 may latch a voltage transmitted through the selected bit line. The main verification circuit 352 may generate a verification signal according to a voltage level received from the latch circuit 330. The verification signal may be transmitted to a second verification circuit 354. The main data input circuit 340 may include two transistors 342 and 344. A first terminal of the transistor 342 may be connected to the latch circuit 330 and a second terminal of the transistor 342 may be connected to a first terminal of the sensing transistor. A first terminal of the transistor 344 may be connected to the latch circuit 330 and a second terminal of the transistor 344 may be connected to the first terminal of the sensing transistor. The sensing circuit of FIG. 3 may be included in the page buffer of the non-volatile memory device.

A transistor 362 may be included between the sensing transistor 360 and the ground, and a transistor 346 may be included between the first terminal of the sensing transistor 360 and the ground.

Referring again to FIGS. 1 and 2, the first source and drain regions D1-D4 may be formed by doping impurities on a semiconductor substrate. For example, if the semiconductor substrate has a first conductive type, the first source and drain regions D1-D4 may be doped with impurities of a second conductive type that is opposite to the first conductive type. Accordingly, the first source and drain regions D1-D4 may form a diode junction with the semiconductor substrate.

The first source and drain regions D1-D4 may only be formed on the semiconductor substrate disposed outside of the transistors. Accordingly, the first source and drain regions D1-D4 may not be formed on the semiconductor substrate disposed between the memory cell transistors TM1_1 through TMn_1, between the memory cell transistor TMn_1 and a string selection transistor TSS1, and/or between the memory cell transistor TM1_1 and the ground selection transistor TGS1.

Second source and drain regions may be formed on the region on which the first source and drain regions D1-D4 are not formed. For example, the second source and drain regions may be formed on a semiconductor substrate disposed between the memory cell transistors TM1_1 through TMn_1. The second source and drain regions may be formed by a fringe field occurring due to the voltage applied to the control gates of the memory cell transistors TM1_1 through TMn_1. Accordingly, the second source and drain regions, which are formed by a field effect, may be distinguished from the first source and drain regions formed by impurities doping.

The second source and drain regions may be selectively formed according an operational mode of the non-volatile memory device. For example, the second source and drain regions may be formed in a program or read mode of the non-volatile memory device and may not be formed in remaining modes. The second source and drain regions may be an inversion layer formed by a field effect and may be similar to a channel.

Figure 5A:
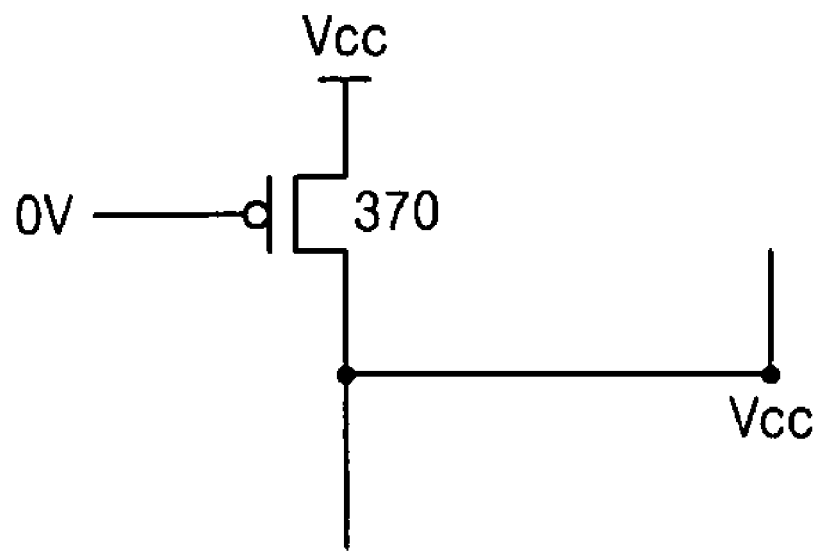
FIGS. 5A and 5B are diagrams for explaining an operation of a pre-charge transistor of FIG. 3.

FIG. 5A is a diagram illustrating that a ground voltage is applied to the control gate of the precharge transistor of FIG. 3.

Referring to FIG. 5A, a ground voltage is applied to the control gate of the precharge transistor 370 and the first voltage Vcc is applied to a second terminal of the precharge transistor 370. Because a ground voltage is applied to the control gate of the precharge transistor 370, the precharge transistor 370 may completely turns on so that the first voltage Vcc applied to the second terminal of the precharge transistor 370 may be transmitted to the first terminal of the precharge transistor 370. Accordingly, the bit line may be precharged to the first voltage Vcc.

Figure 5B:
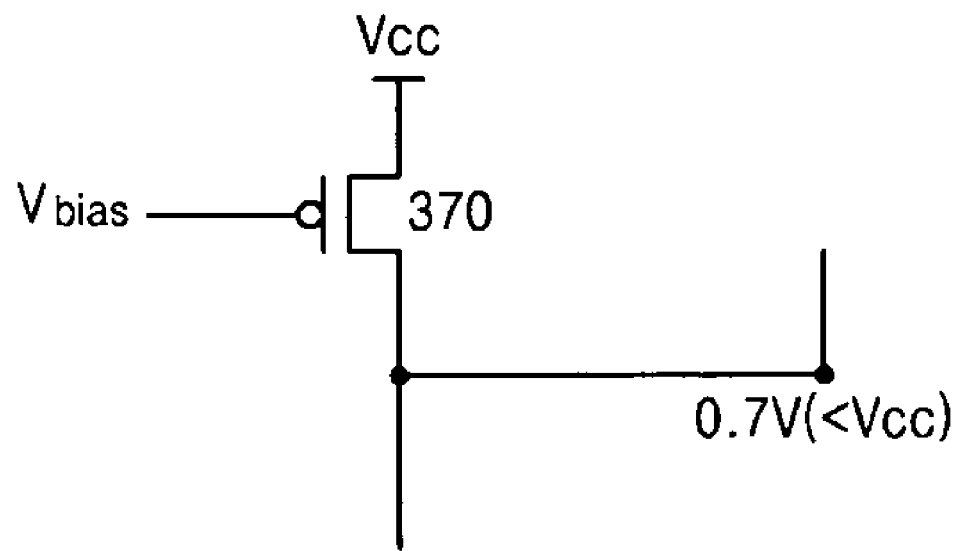

FIG. 5B is a diagram illustrating that a bias voltage that is higher than a ground voltage is applied to the control gate of the precharge transistor of FIG. 3.

Referring to FIG. 5B, if a bias voltage that is higher than a ground voltage is applied to the control gate of the precharge transistor 370, the precharge transistor 370 may not be completely turn on and the first voltage Vcc applied to a second terminal of the precharge transistor 370 may not be transmitted to the first terminal of the precharge transistor 370. Accordingly, the bit line may not be precharged to the first voltage Vcc. In FIG. 5B, the first voltage Vcc decreases to 0.7 V.

A non-volatile memory device according to example embodiments may sense a voltage of a bit line using a sensing transistor with a higher threshold voltage. Accordingly, the non-volatile memory device may more accurately identify a programming state of the memory cell transistor in a string structure where a ground selection line and a bit line are connected to each other.

Although example embodiments have been shown and described in this specification and figures, it would be appreciated by those skilled in the art that changes may be made to the illustrated and/or described example embodiments without departing from their principles and spirit.

What is claimed is:

1. A non-volatile memory device comprising:
   at least one string including a plurality of memory cell transistors connected in series;
   at least one bit line corresponding to the at least one string; and
   a sensing transistor including a gate configured to sense a voltage of the corresponding bit line, wherein a threshold voltage of the sensing transistor is higher than a saturated voltage of the corresponding bit line if the corresponding bit line is read.

2. The non-volatile memory device of claim 1, wherein the threshold voltage is lower than the voltage applied to read the corresponding bit line connected to the memory cell transistor to be read of the plurality of memory cell transistors and is higher than a saturated voltage of the corresponding bit line if the corresponding bit line is read.

3. The non-volatile memory device of claim 1, wherein the threshold voltage of the sensing transistor is higher than a voltage obtained by subtracting a given voltage from a voltage applied to read the corresponding bit line connected to a memory cell transistor to be read of the plurality of memory cell transistors.

4. The non-volatile memory device of claim 1, wherein
the sensing transistor is turned off if the memory cell transistor to be read is in an erase state, and
the sensing transistor is turned on if the memory cell transistor to be read is in a programming state.

5. The non-volatile memory device of claim 1, wherein the at least one string includes a ground selection transistor having a gate connected to the corresponding bit line.

6. The non-volatile memory device of claim 5, wherein
the threshold voltage of the sensing transistor is higher than a saturated voltage of the corresponding bit line connected to the memory cell transistor to be read of the plurality of memory cell transistors which is in an erase state.

7. The non-volatile memory device of claim 6, wherein the threshold voltage of the sensing transistor is higher than 0V.

8. The non-volatile memory device of claim 5, wherein the at least one string includes a ground selection line connected to the gate of the ground selection transistor, the ground selection line being connected to the corresponding bit line.

9. The non-volatile memory device of claim 8, wherein source and drain regions formed by doping impurities are included in a semiconductor substrate disposed between the memory cell transistors and a ground selection transistor and a semiconductor substrate disposed between the memory cell transistors and a string selection transistor.

10. The non-volatile memory device of claim 1, wherein if a voltage is applied to gates of the memory cell transistors a fringe field is generated to form source and drain regions on a semiconductor substrate between the memory cell transistors.

11. The non-volatile memory device of claim 1, further comprising:
a precharge transistor configured to precharge the corresponding bit line.

12. The non-volatile memory device of claim 11, wherein the precharge transistor is a PMOS transistor and a ground voltage is applied to a gate of the precharge transistor to precharge the bit line.

13. The non-volatile memory device of claim 1, wherein the sensing transistor is included in a page buffer.

14. The non-volatile memory device of claim 1, wherein the at least one string comprises:
a string selection transistor having a gate connected to a string selection line; and
a ground selection transistor having a gate connected to the corresponding bit line, and wherein
gates of the plurality of memory cell transistors are connected to corresponding word lines.

15. The non-volatile memory device of claim 14, wherein the threshold voltage is lower than the voltage applied to read the corresponding bit line connected to the memory cell transistor to be read of the plurality of memory cell transistors and is higher than a saturated voltage of the corresponding bit line if the corresponding bit line is read.

16. The non-volatile memory device of claim 14, wherein
the sensing transistor is turned off if the memory cell transistor to be read is in an erase state, and
the sensing transistor is turned on if the memory cell transistor to be read is in a programming state.

17. The non-volatile memory device of claim 14, wherein the at least one string includes a ground selection line connected to the gate of the ground selection transistor, the ground selection line being connected to the corresponding bit line.

18. The non-volatile memory device of claim 14, further comprising:
a precharge transistor configured to precharge the bit line.

19. The non-volatile memory device of claim 18, wherein the precharge transistor is a PMOS transistor and a ground voltage is applied to a gate of the precharge transistor to precharge the bit line.

* * * * *